(12) United States Patent
Pierce

(10) Patent No.: US 7,036,218 B2
(45) Date of Patent: May 2, 2006

(54) METHOD FOR PRODUCING A WAFER INTERPOSER FOR USE IN A WAFER INTERPOSER ASSEMBLY

(75) Inventor: John L. Pierce, Dallas, TX (US)

(73) Assignee: Eaglestone Partners I, LLC, Long Beach, CA (US)

( * ) Notice: Subject to any disclaimer, the term of this patent is extended or adjusted under 35 U.S.C. 154(b) by 166 days.

(21) Appl. No.: 10/373,414

(22) Filed: Feb. 24, 2003

(65) Prior Publication Data

US 2003/0128044 A1    Jul. 10, 2003

Related U.S. Application Data

(62) Division of application No. 09/737,925, filed on Dec. 15, 2000, now Pat. No. 6,529,022.

(51) Int. Cl.
*H01R 9/00*    (2006.01)
*H05K 3/00*    (2006.01)

(52) U.S. Cl. .................. 29/842; 29/593; 29/829; 29/832; 29/840; 29/841; 29/844; 29/847; 29/850; 257/668; 257/690; 324/158.1; 324/754; 324/755; 324/761; 324/765; 361/777; 439/67

(58) Field of Classification Search .............. 29/842, 29/593, 829, 844, 847, 850, 832, 840; 257/668, 257/690; 324/158.1, 754, 755, 765, 761; 439/67; 361/777; 438/637
See application file for complete search history.

(56) References Cited

U.S. PATENT DOCUMENTS

| | | | |
|---|---|---|---|
| 3,939,558 A | 2/1976 | Riley | |
| 4,577,214 A | 3/1986 | Schaper | |
| 4,617,730 A | 10/1986 | Geldermans et al. | |
| 4,628,411 A | 12/1986 | Balderes et al. | |
| 4,688,151 A | 8/1987 | Kraus et al. | |
| 4,868,712 A | 9/1989 | Woodman | |
| 4,998,885 A | 3/1991 | Beaman | |
| 5,016,138 A | 5/1991 | Woodman | |
| 5,060,052 A | 10/1991 | Casto et al. | |
| 5,065,227 A | 11/1991 | Frankeny et al. | |
| 5,086,558 A | 2/1992 | Grube et al. | |
| 5,123,850 A | 6/1992 | Elder et al. | |
| 5,132,613 A | 7/1992 | Papae et al. | |
| 5,148,265 A | 9/1992 | Khandros et al. | |
| 5,148,266 A | 9/1992 | Khandros et al. | |
| 5,309,021 A | 5/1994 | Shimamoto et al. | |
| 5,327,325 A | 7/1994 | Nicewarner, Jr. | |
| 5,347,159 A | 9/1994 | Khandros et al. | |
| 5,347,162 A | 9/1994 | Pasch | |
| 5,371,654 A | 12/1994 | Beaman et al. | |

(Continued)

*Primary Examiner*—A. Dexter Tugbang
*Assistant Examiner*—Tim Phan
(74) *Attorney, Agent, or Firm*—Lawrence R. Youst; Denamraj & Youst, P.C.

(57) ABSTRACT

A method for producing a wafer interposer (210) for use in a wafer interposer assembly is disclosed. The wafer interposer (210) is produced by attaching solder bumps (140) to a lower surface of a support (120). First electrical terminals (130) are attached to an upper surface of the support (120) and substantially correspond to the solder bumps (140). First electrical pathways are provided that passes through the support (120) and connect the solder bumps (140) to the first electrical terminals (130). Second electrical terminals (310) are attached to the upper surface of the support (120). Second electrical pathways (320) connect the first electrical terminals (130) to the second electrical terminals (310).

22 Claims, 2 Drawing Sheets

U.S. PATENT DOCUMENTS

| | | | |
|---|---|---|---|
| 5,382,898 A | 1/1995 | Subramanian | |
| 5,384,691 A | 1/1995 | Neugebauer, deceased et al. | |
| 5,394,303 A | 2/1995 | Yamaji | |
| 5,399,505 A | 3/1995 | Dasse et al. | |
| 5,399,898 A | 3/1995 | Rostoker | |
| 5,410,259 A | 4/1995 | Fujihara et al. | |
| 5,476,211 A | 12/1995 | Khandros | |
| 5,477,160 A | 12/1995 | Love | |
| 5,483,421 A | 1/1996 | Gedney et al. | |
| 5,489,804 A | 2/1996 | Pasch | |
| 5,491,612 A | 2/1996 | Nicewarner, Jr. | |
| 5,497,079 A * | 3/1996 | Yamada et al. | 324/158.1 |
| 5,504,369 A | 4/1996 | Dasse et al. | |
| 5,517,515 A | 5/1996 | Spall et al. | |
| 5,518,964 A | 5/1996 | DiStefano et al. | |
| 5,531,022 A | 7/1996 | Beaman et al. | |
| 5,532,610 A | 7/1996 | Tsujide et al. | |
| 5,532,612 A | 7/1996 | Liang | |
| 5,544,017 A | 8/1996 | Beilin et al. | |
| 5,570,032 A | 10/1996 | Atkins et al. | |
| 5,579,207 A | 11/1996 | Hayden et al. | |
| 5,594,273 A | 1/1997 | Dasse et al. | |
| 5,600,257 A | 2/1997 | Leas et al. | |
| 5,600,541 A | 2/1997 | Bone et al. | |
| 5,612,575 A | 3/1997 | De Givry | |
| 5,615,089 A | 3/1997 | Yoneda et al. | |
| 5,635,010 A | 6/1997 | Pepe et al. | |
| 5,637,920 A | 6/1997 | Loo | |
| 5,654,588 A | 8/1997 | Dasse et al. | |
| 5,655,290 A | 8/1997 | Moresco et al. | |
| 5,685,885 A | 11/1997 | Khandros et al. | |
| 5,701,666 A | 12/1997 | DeHaven et al. | |
| 5,710,071 A | 1/1998 | Beddingfield et al. | |
| 5,714,800 A * | 2/1998 | Thompson | 257/690 |
| 5,759,047 A | 6/1998 | Brodsky et al. | |
| 5,764,071 A | 6/1998 | Chan et al. | |
| 5,764,655 A | 6/1998 | Kirihata et al. | |
| 5,789,807 A | 8/1998 | Correale, Jr. | |
| 5,794,175 A | 8/1998 | Conner | |
| 5,796,746 A | 8/1998 | Farnworth et al. | |
| 5,798,652 A | 8/1998 | Taraci | |
| 5,800,184 A | 9/1998 | Lopergolo et al. | |
| 5,802,713 A | 9/1998 | Deamer | |
| 5,805,422 A | 9/1998 | Otake et al. | |
| 5,806,181 A | 9/1998 | Khandros et al. | |
| 5,825,195 A * | 10/1998 | Hembree et al. | 324/765 |
| 5,832,601 A | 11/1998 | Eldridge et al. | |
| 5,834,844 A | 11/1998 | Akagawa et al. | |
| 5,834,946 A | 11/1998 | Albrow et al. | |
| 5,838,060 A | 11/1998 | Comer | |
| 5,838,072 A | 11/1998 | Li et al. | |
| 5,844,803 A | 12/1998 | Beffa | |
| 5,848,467 A | 12/1998 | Khandros et al. | |
| 5,854,507 A | 12/1998 | Miremadi et al. | |
| 5,869,974 A * | 2/1999 | Akram et al. | 324/754 |
| 5,878,486 A | 3/1999 | Eldridge et al. | |
| 5,885,849 A | 3/1999 | DiStefano et al. | |
| 5,892,287 A | 4/1999 | Hoffman et al. | |
| 5,897,326 A | 4/1999 | Eldridge et al. | |
| 5,900,738 A | 5/1999 | Khandros et al. | |
| 5,905,382 A | 5/1999 | Wood et al. | |
| 5,915,752 A | 6/1999 | DiStefano et al. | |
| 5,927,193 A | 7/1999 | Balz et al. | |
| 5,929,651 A | 7/1999 | Leas et al. | |
| 5,936,847 A | 8/1999 | Kazle | |
| 5,942,246 A | 8/1999 | Mayhew et al. | |
| 5,943,213 A | 8/1999 | Sasov | |
| 5,949,246 A | 9/1999 | Frankeny et al. | |
| 5,950,070 A | 9/1999 | Razon et al. | |
| 5,950,304 A | 9/1999 | Khandros et al. | |
| 5,959,462 A | 9/1999 | Lum | |
| 5,977,640 A | 11/1999 | Bertin et al. | |
| 5,984,691 A | 11/1999 | Brodsky et al. | |
| 5,994,168 A | 11/1999 | Egawa | |
| 6,002,178 A | 12/1999 | Lin | |
| 6,013,944 A | 1/2000 | Moriya et al. | |
| 6,018,462 A | 1/2000 | Sakuyama | |
| 6,020,220 A | 2/2000 | Gilleo et al. | |
| 6,024,275 A | 2/2000 | Takiar | |
| 6,032,356 A | 3/2000 | Eldridge et al. | |
| 6,034,332 A | 3/2000 | Moresco et al. | |
| 6,046,600 A | 4/2000 | Whetsel | |
| 6,049,467 A | 4/2000 | Tamarkin et al. | |
| 6,050,829 A | 4/2000 | Eldridge et al. | |
| 6,053,395 A | 4/2000 | Sasaki | |
| 6,064,213 A | 5/2000 | Khandros et al. | |
| 6,069,026 A | 5/2000 | Terrill et al. | |
| 6,080,264 A | 6/2000 | Ball | |
| 6,080,494 A | 6/2000 | Abbott | |
| 6,082,610 A | 7/2000 | Shangguan et al. | |
| 6,083,773 A | 7/2000 | Lake | |
| 6,098,278 A | 8/2000 | Vindasius et al. | |
| 6,101,100 A | 8/2000 | Londa | |
| 6,104,202 A | 8/2000 | Slocum et al. | |
| 6,133,070 A | 10/2000 | Yagi et al. | |
| 6,136,681 A | 10/2000 | Razon et al. | |
| 6,137,299 A | 10/2000 | Cadieux et al. | |
| 6,147,400 A | 11/2000 | Faraci et al. | |
| 6,154,371 A | 11/2000 | Oba et al. | |
| 6,161,205 A | 12/2000 | Tuttle | |
| 6,190,940 B1 | 2/2001 | DeFelice et al. | |
| 6,218,910 B1 | 4/2001 | Miller | |
| 6,229,216 B1 | 5/2001 | Ma et al. | |
| 6,242,279 B1 | 6/2001 | Ho et al. | |
| 6,242,932 B1 | 6/2001 | Hembree | |
| 6,246,247 B1 | 6/2001 | Eldridge et al. | |
| 6,258,627 B1 | 7/2001 | Benenati et al. | |
| 6,275,051 B1 | 8/2001 | Bachelder et al. | |
| 6,281,046 B1 | 8/2001 | Lam | |
| 6,297,553 B1 | 10/2001 | Horiuchi et al. | |
| 6,303,992 B1 | 10/2001 | Van Pham et al. | |
| 6,313,522 B1 | 11/2001 | Akram et al. | |
| 6,319,829 B1 | 11/2001 | Pasco et al. | |
| 6,331,782 B1 | 12/2001 | White et al. | |
| 6,362,637 B1 * | 3/2002 | Farnworth et al. | 324/755 |
| 6,372,547 B1 | 4/2002 | Nakamura et al. | |
| 6,372,548 B1 | 4/2002 | Bessho et al. | |
| 6,376,769 B1 | 4/2002 | Chung | |
| 6,392,428 B1 | 5/2002 | Kline et al. | |
| 6,432,744 B1 | 8/2002 | Amador et al. | |
| 6,440,771 B1 | 8/2002 | Pierce | |
| 6,483,043 B1 | 11/2002 | Kline | |
| 6,483,330 B1 | 11/2002 | Kline | |
| 6,524,885 B1 | 2/2003 | Pierce | |
| 6,529,022 B1 | 3/2003 | Pierce | |
| 6,537,831 B1 | 3/2003 | Kline | |
| 6,627,998 B1 | 9/2003 | Caletka et al. | |
| 6,717,819 B1 | 4/2004 | Chung | |
| 6,759,741 B1 | 7/2004 | Kline | |
| 6,812,048 B1 | 11/2004 | Kline | |
| 6,815,712 B1 | 11/2004 | Kline | |
| 6,822,469 B1 | 11/2004 | Kline | |
| 6,825,678 B1 | 11/2004 | Kline | |
| 2002/0011663 A1 | 1/2002 | Khandros et al. | |

* cited by examiner

METHOD FOR PRODUCING A WAFER INTERPOSER FOR USE IN A WAFER INTERPOSER ASSEMBLY

CROSS-REFERENCE TO RELATED APPLICATION

This is a divisional application of application Ser. No. 09/737,925, entitled Water Testing Interposer for a Conventional Package, filed on Dec. 15, 2000 in the name of John L. Pierce, now U.S. Pat. No. 6,529,022 B2.

TECHNICAL FIELD OF THE INVENTION

The present invention relates in general to the field of semiconductor product testing, and more particularly to a method for producing a wafer interposer for use in a wafer interposer assembly.

BACKGROUND OF THE INVENTION

The three stages of semiconductor device manufacture are wafer fabrication, assembly and testing. The testing stage always includes an evaluation of the electrical connections within the device, and often includes burn-in testing as well. In a conventional manufacturing process, before testing is done, the semiconductor wafer is diced into individual semiconductor dies, and the dies are assembled into packages. The purpose of the package is to protect the semiconductor die as well as provide connections that allow the package to be attached to a testing apparatus or printed circuit board. The fact that the testing of the individual dies does not take place until the dies have been packaged, increases the cost. This increased cost stems from the greater complexity, size, and quantity of the testing apparatus, as well as the difficulty of manipulating large quantities of separately packaged dies.

In addition to the tooling and labor costs associated with electrical and burn-in testing of individually packaged dies, there is also the wasted expense of packaging the dies that will subsequently be found to be defective. Since in a conventional process all dies must be packaged before any testing can be done, this means that all defective die will necessarily be packaged, and the expense of doing so is complete waste. For example, if 6%, a conservative estimate, of the dies fail either the electrical or burn-in testing, that is 60 die packaging operations that are wasted for every 1000 dies that are produced. The ability to test the dies before the packaging operations would obviously reduce production costs.

The savings associated with a wafer level testing protocol are multifold. In addition to the savings associated with the elimination of unnecessary packaging operations, inventory carrying costs are reduced because the processing cycle times are reduced since "good" dies are identified earlier in the manufacturing process.

Accordingly, there is a need for a wafer interposer and a method that allows for the testing of semiconductor dies while still assembled in wafer form. It is also important that the wafer interposer and method does not impede the ability to package the dies after they have passed the testing and have been cut from the wafer.

SUMMARY OF THE INVENTION

The present invention overcomes the limitations and drawbacks of the existing art by providing a method of producing an interposer for use in a wafer interposer assembly that allows for the testing of semiconductor dies while still assembled in wafer form.

In one aspect, the present invention is directed to a method of producing an interposer. The method includes attaching a solder bump to a lower surface of a support. A first electrical terminal is attached to an upper surface substantially corresponding to the solder bump. A first electrical pathway is created that passes through the support and connects the solder bump to the first electrical terminal. A second electrical terminal is attached to the upper surface of the support and a second electrical pathway is created in order to connect the first electrical terminal to the second electrical terminal.

In one embodiment, a plurality of first electrical terminals are positioned on the upper surface in a pattern that may include a pattern distributed around the outer edges of the support. Alternatively, the plurality of first electrical terminals may be positioned in a quadrilateral pattern distributed around the outer edges of the support. Similarly, a plurality of second electrical terminals may be included and positioned within the pattern formed by the first electrical terminals. The plurality of second electrical terminals may be selected to have a pitch that is greater than the pitch of the first electrical terminals.

In another aspect, the present invention is directed to a method for producing a wafer interposer assembly. A wafer interposer and a semiconductor wafer are provided. The semiconductor wafer includes a plurality of semiconductor dies having a first and a second surface. Each semiconductor die includes a plurality of third electrical terminals on the first surface of the wafer. The third electrical terminals on the first surface of the semiconductor wafer are aligned with the solder bumps on the lower surface of the wafer interposer. The wafer interposer is affixed to the semiconductor wafer, thereby producing a wafer interposer assembly.

In one embodiment, the wafer interposer and the semiconductor wafer are affixed by heating the wafer interposer and semiconductor wafer to form a connection between the solder bumps and the third electrical terminals. The wafer interposer assembly may be attached to a testing apparatus in order to test or parametrically test at least one of the semiconductor dies. Alternatively, burn-in, sequential and/or simultaneous testing may be performed on at least one of the semiconductor dies. The testing of at least one of the semiconductor dies may further comprise the use of a multiplexer.

The performance level of each of the semiconductor dies may be graded during the testing and sorting of the semiconductor chip assemblies based on the performance of the constituent dies. The testing may be performed in order to eliminate defective die from the wafer interposer assembly. Moreover, the wafer interposer assembly may be integrated into a semiconductor package such as a package selected from the group consisting of ball grid arrays, lan grid arrays, dual in-line packages and chip scale packages. Alternatively, a portion of the wafer interposer may be wire bonding or integrated into a flip chip assembly.

BRIEF DESCRIPTION OF THE DRAWINGS

The above and further advantages of the invention may be better understood by referring to the following description in conjunction with the accompanying drawings in which corresponding numerals in the different figures refer to the corresponding parts in which.

DETAILED DESCRIPTION OF THE INVENTION

While the making and using of various embodiments of the present invention are discussed herein in terms of a wafer testing interposer and semiconductor wafer assembly apparatus and method, it should be appreciated that the present invention provides many inventive concepts that can be embodied in a wide variety of contexts. The specific embodiments discussed herein are merely illustrative of specific ways to make and use the invention, and in no way meant to limit the scope of the invention.

The present invention provides a wafer testing interposer that can be combined with a semiconductor wafer to form an assembly that can be used to test semiconductor die prior to dicing or singulating. This allows several manufacturing steps to be eliminated and thus results in improved first pass yields, decreased manufacturing times, and improved cycle times.

Additionally, the use of the interposer revolutionizes the processing of the semiconductor dies by enabling testing and burn-in at the wafer level. Eliminating the need to singulate and package the dies before testing results in a significant cost avoidance opportunity for chip manufacturers. The fact that the use of the interposer accomplishes all of this while adding no impediment to the packaging of the singulated die produced after successful testing is another substantial benefit of the present invention.

Figure 1:
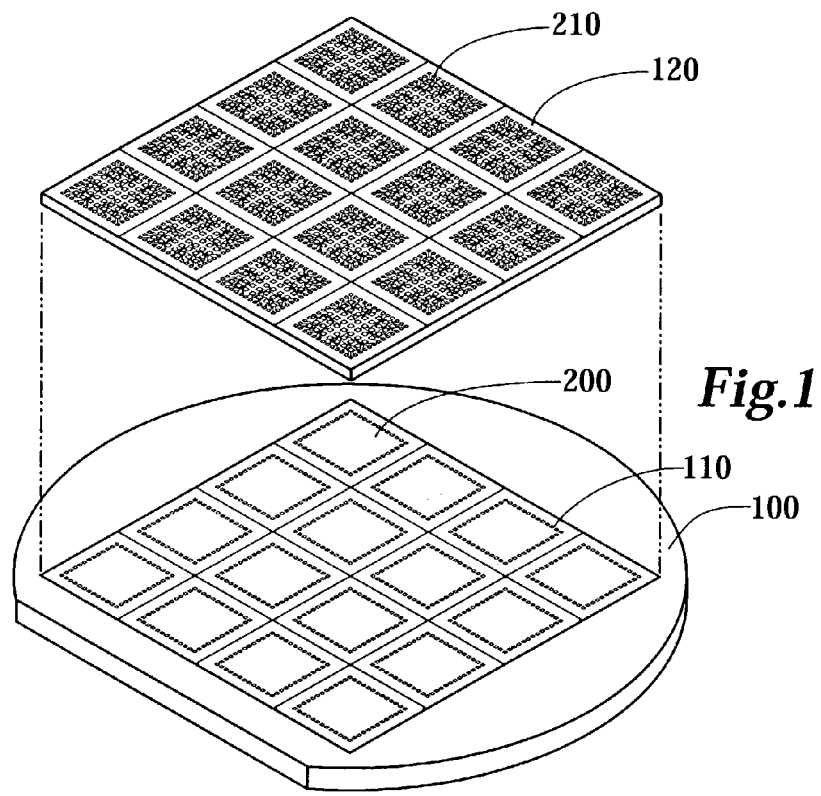
FIG. 1 shows a wafer testing interposer juxtaposed with a semiconductor wafer, in accordance with the present invention.
Figure 2:
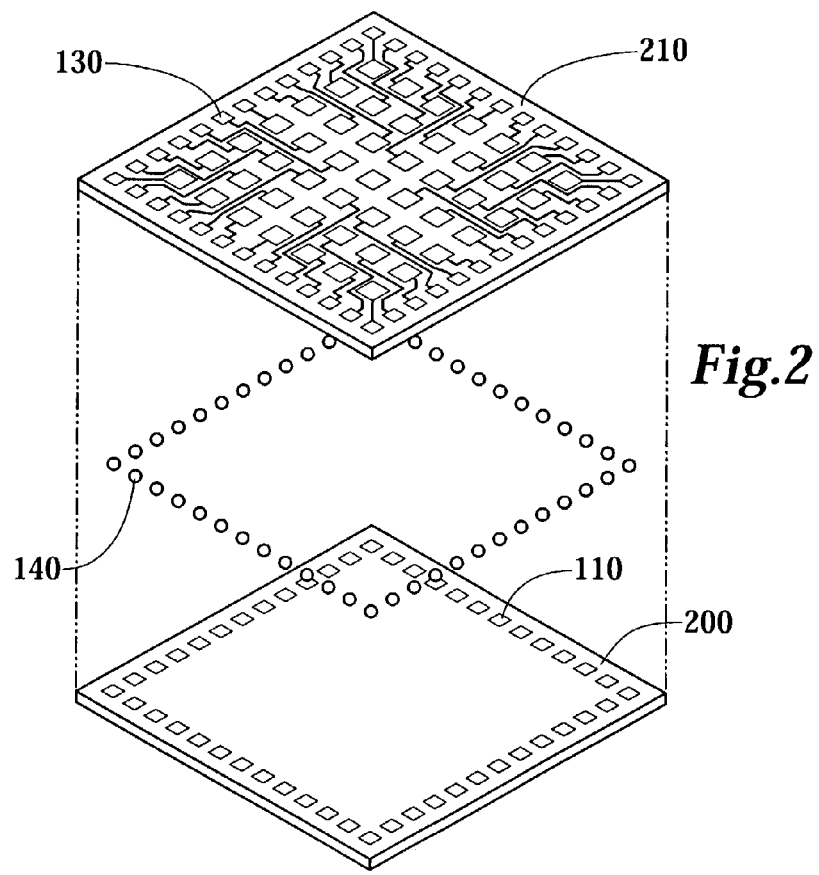
FIG. 2 shows a portion of the lower surface of a wafer testing interposer and a portion of the first surface of a die from a semiconductor wafer in accordance with the present invention.

FIG. 1 shows one form of the invention as a quadrilateral wafer interposer comprising a support 120, which has a set of electrical terminals 130 on the upper surface and solder bumps 140 of FIG. 2 on the lower surface. The solder bumps on the lower surface are aligned with another set of electrical terminals 110 on the surface of the semiconductor die that is part of a semiconductor wafer 100. The solder bumps 140 of FIG. 2 correspond directly to the electrical terminals 110 and a permanent contact can be created between the two by means of heating, or the application of a conductive adhesive. The interposer can be made of any nonconductive material that does not add excessive thickness to the interposer-wafer combination that would complicate the subsequent packaging of the interposer-wafer components produced in the singulating process.

FIG. 2 shows the top of a single semiconductor die 200 with a set of electrical terminals in the form of pads 110 distributed near the outer edges of the die and creating a quadrilateral pattern. A corresponding portion of the lower side of the interposer 210 is also shown, and the solder bumps 140 on it can be seen to form a similar quadrilateral pattern to the pads on the semiconductor die.

Figure 3:
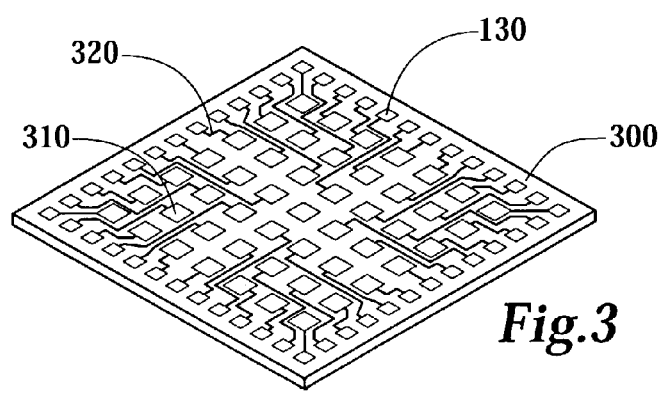
FIG. 3 shows a portion of the upper surface of a wafer testing interposer in accordance with the present invention.

FIG. 3 shows a portion of the upper surface of an interposer 300 that would cover a single semiconductor die.

Two sets of electrical terminals in the form of pads are shown. The first set 130 correspond to the position of the solder bumps on the lower surface of the interposer. The second set of pads 310 are contained within the quadrilateral shape formed by the first set 130. The second set of pads 310 allow for the testing and burn-in of the semiconductor dies while they are still part of a semiconductor wafer. The two sets of pads are connected by electrical pathways 320, which can be either on the surface of the support 300, or in the alternative, within the support. There is a one to one correspondence between the 130 pads and the 310 pads. In order to facilitate the testing and burn-in, the pads 310 are larger in size and have greater pitch that the 130 pads. The greater size of the 310 pads allows for the use of existing contact methods in the testing and burn-in of the die before singulating the semiconductor wafer. During the parametric and burn-in testing, a map of the "level of goodness" of the dies can be prepared so that subsequent processing will only use the dies which meet the requirement of the particular application they are to be used in. By identifying the dies that do not have the required "level of goodness" while they are still part of the semiconductor wafer, unnecessary packing of defective dies is eliminated, and the subsequent steps in the production sequence are made more efficient since the defective dies have been removed at the earliest possible stage in the process.

Figure 4:
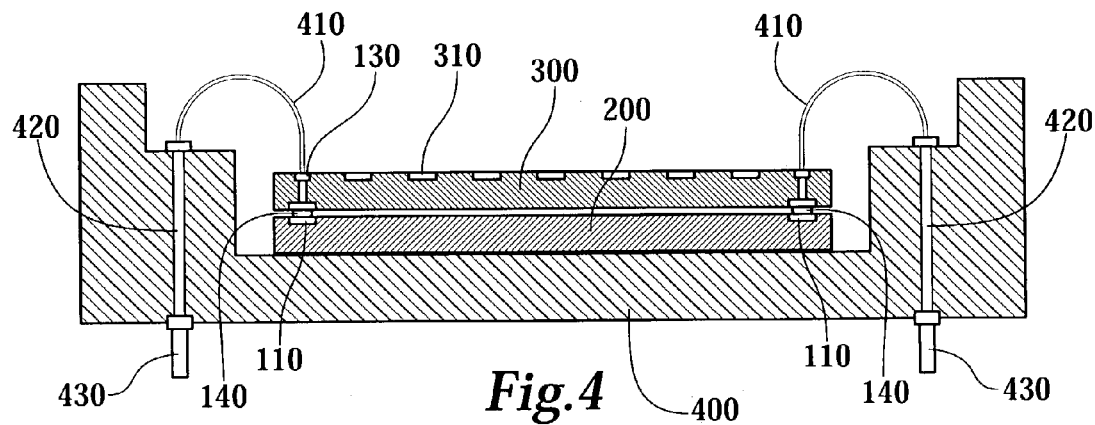
FIG. 4 shows a chip assembly after it has been singulated from wafer testing interposer and semiconductor wafer assembly and mounted in a chip package in accordance with the present invention.

FIG. 4 shows a singulated wafer interposer 300 and semiconductor die 200 assembly mounted in a conventional semiconductor package. The tested singulated semiconductor die 200 is attached to the corresponding section of wafer testing interposer 300 and attached into the package 400. The present invention is compatible with all existing semiconductor packages, including, but not limited to, Ball Grid Arrays, Lan Grid Arrays, Dual In-line packages, as well as Chip Scale packages. Connection of the singulated dies to the package is accomplished by using wire bonds 410. A gold or aluminum wire is bonded to each topside pad 130 on the die and to a corresponding package pad. The connection is continued from the package pad through the body of the package 400 by vias 420 and electrical pathways 430. The leads 430 that exit the package are in turn used to attach the package to a printed circuit board or other connection vehicle, whichever is appropriate for the particular application involved.

The singulated die and interposer combination can also be wire bonded or flip chip assembled directly to the printed circuit board when space is at a premium. It can also be wire bonded or flip chip assembled directly to any contactable surface in any configuration as required by the application. Examples of applications for direct attachment include watches, aircraft skin, intelligent pens, and medical instruments. In flip chip applications the use of an underfill is desirable, and the present invention is compatible with all currently available underfill materials. In the applications mentioned above, it is most likely that a no-flow underfill would be the best option.

While this invention has been described with a reference to illustrative embodiments, this description is not intended to be construed in a limiting sense. Various modifications and combinations of the illustrative embodiments as well as other embodiments of the invention, will be apparent to persons skilled in the art upon reference to the description. It is, therefore, intended that the appended claims encompass any such modifications or embodiments.

What is claimed is:

1. A method of producing a wafer testing interposer comprising the steps of:

providing a support having a first surface and a second surface;
attaching first electrical terminals to the first surface in the form of a pattern;
coupling second electrical terminals to the second surface of the support such that the second electrical terminals substantially correspond to the first electrical terminals;
creating first electrical pathways passing through the support that connect the second electrical terminals to the first electrical terminals;
positioning third electrical terminals on the first surface of the support, the third electrical terminals positioned within the pattern of the first electrical terminals, the third electrical terminals having a greater size and pitch than the first electrical terminals; and
creating second electrical pathways that connect the first electrical terminals to the third electrical terminals.

2. The method as recited in claim 1 further comprising the step of arranging the first and second electrical terminals in a pattern distributed around the outer edges of the support.

3. The method as recited in claim 2 further comprising the step of arranging the first and second electrical terminals in a quadrilateral pattern distributed around the outer edges of the support.

4. The method as recited in claim 1 further comprising the step of attaching a semiconductor wafer having a plurality of semiconductor die to the support such that electrical terminals on the semiconductor die are electrically coupled to the second electrical tenninals, thereby forming a wafer interposer assembly.

5. The method as recited in claim 4 further comprising the step of testing the semiconductor die using the third electrical terminals.

6. The method as recited in claim 5 further comprising the step of performing parametric testing of the semiconductor die.

7. The method as recited in claim 5 further comprising the step of performing burn-in testing of the semiconductor die.

8. The method as recited in claim 5 further comprising the steps of grading a performance level of the semiconductor die.

9. The method as recited in claim 4 further comprising the step of integrating a portion of the wafer interposer assembly into a semiconductor package.

10. The method as recited in claim 9 wherein the step of integrating a portion of the wafer interposer assembly into a semiconductor package further comprises forming a semiconductor package selected from the group consisting of ball grid arrays, lan grid arrays, dual in-line packages and chip scale packages.

11. The method as recited in claim 9 wherein the step of integrating a portion of the wafer interposer assembly into a semiconductor package further comprises wire bonding the portion of the wafer interposer to form the semiconductor package.

12. The method as recited in claim 9 wherein the step of integrating a portion of the wafer interposer assembly into a semiconductor package further comprises flip chip connecting the portion of the wafer interposer to form the semiconductor package.

13. A method of producing a wafer testing interposer comprising the steps of:
providing a support having a first surface and a second surface;
attaching first electrical terminals to the first surface in the form of a pattern distributed around the outer edges of the support;
coupling second electrical terminals to the second surface of the support, each of the second electrical terminals corresponding to one of the first electrical terminals;
creating first electrical pathways passing through the support that connect the second electrical terminals to the corresponding first electrical terminals;
positioning third electrical terminals on the first surface of the support, the third electrical terminals positioned within the pattern of the first electrical terminals, the third electrical terminals having a greater size and pitch than the first electrical terminals, each of the third electrical terminals corresponding to one of the first electrical terminals; and
creating second electrical pathways that connect the third electrical terminals to the corresponding first electrical terminals.

14. The method as recited in claim 13 further comprising the step of attaching a semiconductor wafer having a plurality of semiconductor die to the support such that electrical terminals on the semiconductor die are electrically coupled to the second electrical terminals, thereby forming a wafer interposer assembly.

15. The method as recited in claim 14 further comprising the step of testing the semiconductor die using the third electrical terminals.

16. The method as recited in claim 15 further comprising the step of performing parametric testing of the semiconductor die.

17. The method as recited in claim 15 further comprising the step of performing burn-in testing of the semiconductor die.

18. The method as recited in claim 15 further comprising the steps of grading a performance level of the semiconductor die.

19. The method as recited in claim 14 further comprising the step of integrating a portion of the wafer interposer assembly into a semiconductor package.

20. The method as recited in claim 19 wherein the step of integrating a portion of the wafer interposer assembly into a semiconductor package further comprises forming a semiconductor package selected from the group consisting of ball grid arrays, lan grid arrays, dual in-line packages and chip scale packages.

21. The method as recited in claim 19 wherein the step of integrating a portion of the wafer interposer assembly into a semiconductor package further comprises wire bonding the portion of the wafer interposer to form the semiconductor package.

22. The method as recited in claim 19 wherein the step of integrating a portion of the wafer interposer assembly into a semiconductor package further comprises flip chip connecting the portion of the wafer interposer to form the semiconductor package.

* * * * *